(12) United States Patent
Jeong et al.

(10) Patent No.: US 7,894,258 B2
(45) Date of Patent: Feb. 22, 2011

(54) FLASH MEMORY DEVICE FOR DETERMINING MOST SIGNIFICANT BIT PROGRAM

(75) Inventors: Yong-Taek Jeong, Daegu (KR); Sang-Chul Kang, Hwaseong-si (KR); Kyong-Ae Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 188 days.

(21) Appl. No.: 12/188,057

(22) Filed: Aug. 7, 2008

(65) Prior Publication Data
US 2009/0147574 A1 Jun. 11, 2009

(30) Foreign Application Priority Data
Dec. 7, 2007 (KR) .................. 10-2007-0126948

(51) Int. Cl.
*G11C 11/34* (2006.01)
(52) U.S. Cl. .................. 365/185.03; 365/185.18; 365/189.02
(58) Field of Classification Search ............ 365/185.03, 365/185.18, 189.02, 191, 185.23, 189.03, 365/230.02, 230.06, 230.03
See application file for complete search history.

(56) References Cited

U.S. PATENT DOCUMENTS

| | | | |
|---|---|---|---|
| 7,057,939 B2 | 6/2006 | Li et al. | |
| 7,280,396 B2 | 10/2007 | Li et al. | |
| 7,532,495 B2 * | 5/2009 | Youn et al. | 365/63 |
| 7,548,457 B2 * | 6/2009 | Kang et al. | 365/185.03 |
| 2003/0043628 A1 * | 3/2003 | Lee | 365/185.17 |
| 2005/0180209 A1 | 8/2005 | Lasser | |
| 2007/0002613 A1 | 1/2007 | Rahman et al. | |
| 2008/0094893 A1 * | 4/2008 | Choi | 365/185.03 |

FOREIGN PATENT DOCUMENTS

| | | |
|---|---|---|
| KR | 10-2006-0133599 | 12/2006 |
| KR | 10-2007-0012810 | 1/2007 |
| WO | WO 2005/076745 | 8/2005 |
| WO | WO 2005/109443 | 11/2005 |

OTHER PUBLICATIONS

International Publication No. WO 2005/109443 for 10-2007-0012810.
International Publication No. WO 2005/076745 for 10-2006-0133599.

* cited by examiner

*Primary Examiner*—Dang T Nguyen
(74) *Attorney, Agent, or Firm*—F. Chau & Associates, LLC

(57) ABSTRACT

A flash memory device capable of efficiently determining whether most significant bit (MSB) programming has been performed is provided. The flash memory device includes a cell array, a control unit, and a determination unit. The cell array includes at least one flag cell for storing information about whether MSB programming has been performed on a multi-level cell. The control unit controls a program operation, a read operation, and an erasure operation with respect to the cell array. The determination unit receives flag data stored in the flag cells, performs an OR operation and/or an AND operation on the flag data, and generates a determination signal based on a result of the OR operation and/or the AND operation, wherein the determination signal represents whether the MSB programming has been performed.

21 Claims, 4 Drawing Sheets

FIG. 6

| LEVELS AND READING METHODS | DETERMINATION METHODS |
|---|---|
| VR1 NORMAL READ | ORING |
| VR1 INVERSE READ | ANDING |
| VR2 NORMAL/INVERSE | DON'T CARE |
| VR3 NORMAL READ | ANDING |
| VR3 INVERSE READ | ORING |

# FLASH MEMORY DEVICE FOR DETERMINING MOST SIGNIFICANT BIT PROGRAM

CROSS-REFERENCE TO RELATED PATENT APPLICATION

This application claims the benefit of Korean Patent Application No. 10-2007-0126948, filed on Dec. 7, 2007, in the Korean Intellectual Property Office, the disclosure of which is incorporated herein in its entirety by reference.

BACKGROUND OF THE INVENTION

1. Technical Field

The present invention relates to flash memory devices, and more particularly, to a flash memory device for determining a most significant bit (MSB) program.

2. Discussion of the Related Art

The demand for flash memory, which is a form of nonvolatile memory, is increasing. Flash memory, which is an electrically erasable and programmable nonvolatile memory, can retain data even when no power is supplied thereto.

With the development of flash memory devices and their related technology, multi level cell (MLC) technology capable of increasing the storage capacity of flash memory devices by storing two or more bits, in a single memory cell is widely used. In MLC technology, a single cell is programmed with several threshold voltages so that two or more bits can be stored in the single memory cell. This is distinguished from single level cell (SLC) technology where only one bit is stored in a single memory cell.

FIG. 1A is a graph illustrating threshold voltage distributions of single-level cells, and FIG. 1B is a graph illustrating threshold voltage distributions of multi-level cells.

Referring to FIG. 1A, when a flash memory device follows SLC technology, only one bit of data is stored in each memory cell. Thus, each memory cell is programmed with one of two states, each defined by distinct threshold voltages. The two states may be expressed as [1] and [0]. On the other hand, referring to FIG. 1B, when the flash memory device follows MLC technology, data corresponding to a plurality of bits (e.g., 2-bit data) is stored in each memory cell. Thus, each memory cell is programmed with one of four states, each defined by distinct threshold voltages. The four states may be expressed as, for example, [11], [10], [01], and [00]. When data corresponding to a plurality of bits is stored in each memory cell, a data value corresponding to each of the states of threshold voltages may vary according to the design of a memory device. For example, in FIG. 1B, four threshold voltages, in order form a lowest threshold voltage to a highest threshold voltage, correspond to data of [11], [01], [00], and [10], but the values of the data corresponding to the threshold voltages may vary according to the design of a memory device. For example, the four threshold voltages, in order from a lowest voltage to a highest voltage, may correspond to data [11], [10], [01], and [00], respectively.

When a memory cell is programmed according to MLC technology as described above, generally, a least significant bit (LSB) is programmed first and then a most significant bit (MSB) is programmed. Therefore, when a flash memory device is based on MLC technology, in performing a normal program operation, a read operation, etc. on a memory cell, a determination is made as to whether only LSB programming has been performed on the memory cell or if both LSB and MSB programming have been performed.

In the conventional art, a determination as to whether MSB programming has been executed is made in an MLC mode, by using flag data. However, this determining method may require a complicated circuit. In addition, when the distribution of a cell that stores flag data is changed because of, for example, a PE cycle and a hot temperature stress (HTS), it may be difficult to accurately determine whether MSB programming has been executed. Therefore, a technique for efficiently determining execution or non-execution of MSB programming using a simple circuit design is desired.

SUMMARY OF THE INVENTION

Exemplary embodiments of the present invention provide a flash memory device capable of accurately determining whether most significant bit (MSB) programming has been performed.

According to an aspect of the present invention, a flash memory device includes a cell array including at least one flag cell for storing information about whether MSB (most significant bit) programming has been performed on a multi-level cell. A control unit controls a program operation, a read operation, and an erasure operation with respect to the cell array. A determination unit receives flag data stored in the flag cells, performs an OR operation and/or an AND operation on the flag data, and generates a determination signal based on a result of the OR operation and/or the AND operation. The determination signal represents whether the MSB programming has been performed.

The determination signal may be provided to the control unit, and the control unit may control the programming operation of the cell array according to a state of the determination signal.

The determination unit may provide results of either the OR operation or the AND operation as the determination signal according to a level of a voltage for reading the flag cells.

The determination unit may provide results of either the OR operation or the AND operation as the determination signal according to whether a method of reading the flag cells is a normal reading method or an inverse reading method.

The determination unit may include a first arithmetic operation unit receiving the flag data, performing an OR operation on the flag data, and outputting a first operation result. A second arithmetic operation unit receives the flag data, performs an AND operation on the flag data, and outputs a second operation result.

The determination unit may further include a multiplexer for receiving the first and second operation results and outputting the first or the second operation results.

The determination unit may further include a control signal generation unit which provides a control signal to the multiplexer and controls the multiplexer to output the first or second operation results.

The control signal generation unit may generate the control signal based on information about the level of the voltage for reading the flag cells and information about whether the method of reading the flag cells is the normal reading method or the inverse reading method.

There may be "n" threshold voltage distributions formed according to data stored in the multi-level cell, (n−1) voltages may be set to read the data, and the flag cells may be programmed with either a lowest or highest threshold voltage distribution from among the threshold voltage distributions.

When the voltage for reading the flag cells is a lowest voltage from among the (n−1) voltages and the flag cells are read according to the normal reading method, the determination unit may generate, as the determination signal, a result of the OR operation performed on the flag data.

When the voltage for reading the flag cells is the lowest voltage from among the (n−1) voltages and the flag cells are read according to the inverse reading method, the determination unit may generate, as the determination signal, a result of the AND operation performed on the flag data.

When the voltage for reading the flag cells is a highest voltage from among the (n−1) voltages and the flag cells are read according to the normal reading method, the determination unit may generate, as the determination signal, a result of the AND operation performed on the flag data.

When the voltage for reading the flag cells is the highest voltage from among the (n−1) voltages and the flag cells are read according to the inverse reading method, the determination unit may generate, as the determination signal, a result of the AND operation performed on the flag data.

When the flag cells are read by voltages other than the highest and lowest voltages from among the (n−1) voltages, the determination unit may arbitrarily generate the results of either the OR operation or the AND operation as the determination signal.

In the flash memory device, a plurality of flag cells may be arranged to correspond to each of programming units into which the multi-level cell is divided.

According to an aspect of the present invention, there is provided a flash memory device including multi-level cells. The flash memory device includes at least one flag cell storing information about a stage in which a multi-level cell is programmed. A control unit controls an operation of the flash memory device. A determination unit performs an OR operation and/or an AND operation on flag data stored in the flag cells and generates a determination signal based on a result of the OR operation and/or the AND operation and determines the stage in which the multi-level cell is programmed.

According to an aspect of the present invention, there is provided a flash memory device including multi-level cells, the flash memory device includes at least one flag cell storing information about a stage in which a multi-level cell is programmed. A control unit controls an operation of the flash memory device. A determination unit independently performs at least two logic operations on flag data stored in the flag cells and generates, as a determination signal, one of the performed logic operations selected according to a level of a voltage for reading the flag cells and determines the stage in which the multi-level cell is programmed.

According to an aspect of the present invention, there is provided a flash memory device including multi-level cells. The flash memory device includes at least one flag cell storing information about a stage in which a multi-level cell is programmed. A control unit controls an operation of the flash memory device. A determination unit independently performs at least two logic operations on flag data stored in the flag cells and generates, as a determination signal, one of the performed logic operations selected according to a method of reading the flag cells and determines the stage in which the multi-level cell is programmed.

BRIEF DESCRIPTION OF THE DRAWINGS

The above and other features and aspects of exemplary embodiments of the present invention will be described in detail below with reference to the attached drawings in which:

FIG. 6 illustrates a table showing read voltage levels of flag cells and different determination methods for different read methods.

DETAILED DESCRIPTION OF EXEMPLARY EMBODIMENTS

Figure 1A:
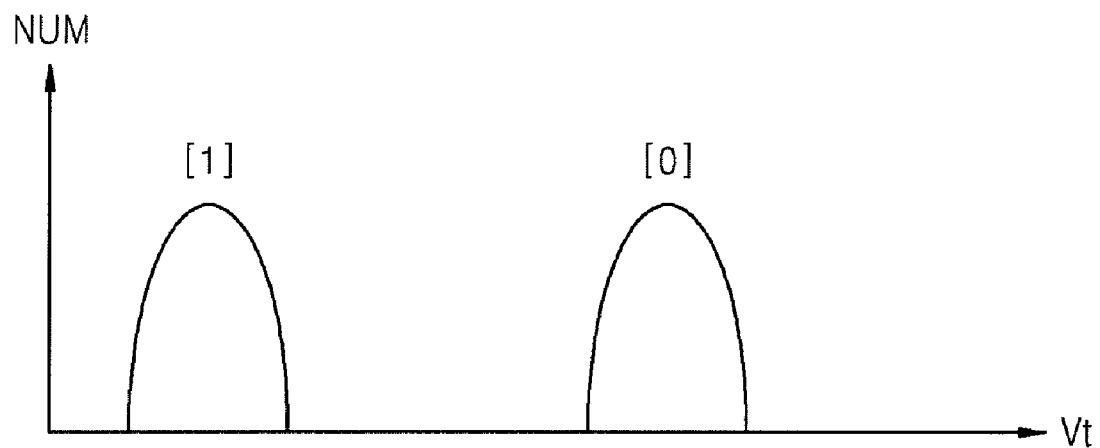
FIG. 1A is a graph illustrating threshold voltage distributions of single-level cells.
Figure 1B:
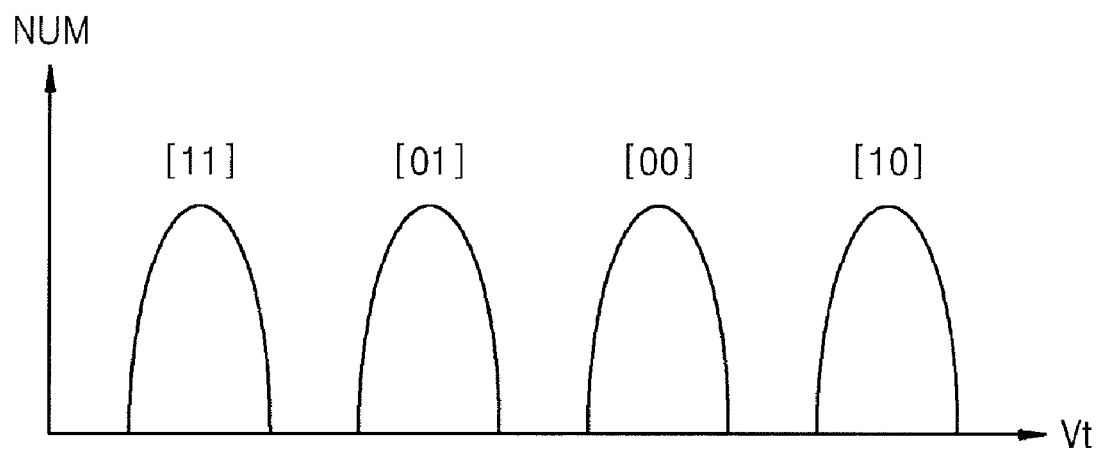
FIG. 1B is a graph illustrating threshold voltage distributions of multi-level cells.

The attached drawings for illustrating exemplary embodiments of the present invention are referred to in order to gain a sufficient understanding of the present invention.

Hereinafter, the present invention will be described in detail by explaining exemplary embodiments of the invention with reference to the attached drawings. Like reference numerals in the drawings may denote like elements.

Figure 2:
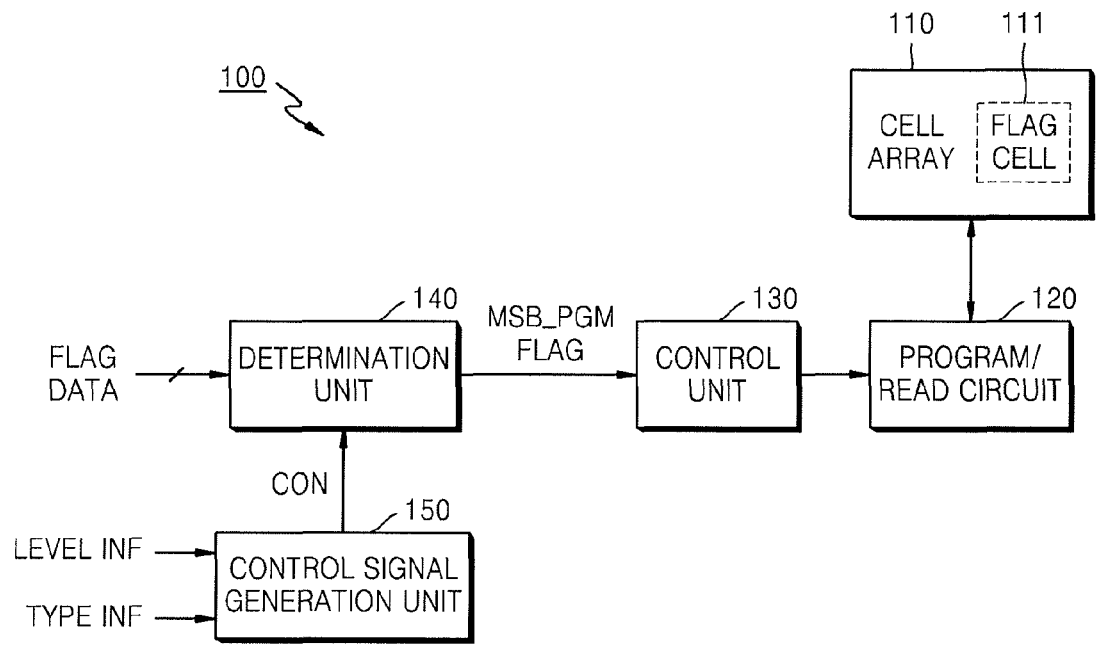
FIG. 2 is a block diagram of a flash memory device according to an exemplary embodiment of the present invention.

FIG. 2 is a block diagram of a flash memory device 100 according to an exemplary embodiment of the present invention. Referring to FIG. 2, the flash memory device 100 may include a cell array 110 including flash memory cells for storing data, a program/read circuit 120 for programming or reading data in or from the cell array 110, and a control unit 130 for controlling the operations of the flash memory device 100 including a data program/read operation.

The cell array 110 includes multi-level cells each of which stores a plurality of bits of data. When a plurality of bits of data is stored in a multi-level cell, the bits may be stored one-by-one. For example, when 2 bits of data are stored in each memory cell, a program operation for storing data corresponding to an LSB is performed, and then a program operation for storing data corresponding to an MSB is performed.

Upon programming a multi-level cell, when an operation of storing data corresponding to an LSB in the multi-level cell has been performed, the multi-level cell is read according to a method of reading a single-level cell. On the other hand, when an operation of storing data corresponding to an MSB in the multi-level cell has been performed, the multi-level cell is read according to a method of reading a multi-level cell. This is because a threshold voltage distribution for execution of LSB programming is different than a threshold voltage distribution for execution of MSB programming.

Accordingly, in order for the flash memory device 100 including multi-level cells to perform a normal operation, information about a programming stage that a memory cell has undergone (for example, whether only LSB programming has been performed or up to MSB programming has been performed) is stored. The information may be stored in a flag cell 111 included in the cell array 110. A plurality of flag cells 111 may be included for each of the programming units (for example, pages) into which a multi-level cell is divided. When only LSB programming has been performed with respect to a programming unit of the memory cell, a data state "1" may be stored in the flag cells 111. On the other hand, when MSB programming has been performed with respect to the corresponding programming unit of the memory cell, a data state "0" may be stored in the flag cells 111.

The flash memory device 100 according to an exemplary embodiment further includes a determination unit 140 for determining a programming stage that a memory cell has undergone based on flag data FLAG DATA stored in the flag cell 111. The determination unit 140 may receive the flag data FLAG DATA from the flag cell 111 and perform an OR operation and/or an AND operation with respect to the flag data FLAG DATA. The determination unit 140 generates a result of the at least one performed operation as a determination signal MSB_PGM FLAG that represents the programming stage that the memory cell has undergone. The determination signal MSB_PGM FLAG is provided to the control unit 130, and the control unit 130 controls the program/read circuit 120 based on the determination signal MSB_PGM FLAG. Accordingly, the program/read circuit 120 independently performs a data program/read operation on a memory cell in a programming stage where only LSB programming has been performed and the memory cell in a programming stage where the MSB programming has also been performed.

The determination unit 140 generates, as the determination signal MSB_PGM FLAG, a result of the OR operation or the AND operation with respect to the flag data FLAG DATA. The determination signal MSB_PGM FLAG is information representing a programming stage that the corresponding memory cell has undergone, for example, information representing whether MSB programming has been performed on the corresponding memory cell. For example, when the determination signal MSB_PGM FLAG is a logic high, it represents that only the LSB programming has been performed on the memory cell. On the other hand, when the determination signal MSB_PGM FLAG is a logic low, it represents that up to the MSB programming has been performed on the memory cell.

The determination unit 140 may independently perform a plurality of operations including an OR operation and an AND operation with respect to the plurality of flag data FLAG DATA. When the determination unit 140 performs a plurality of operations as described above, a result of one of the performed operations is generated as the determination signal MSB_PGM FLAG. In this case, the flash memory device 100 may further include a control signal generation unit 150 which generates a control signal CON for selecting a result of one of the plurality of performed operations and provides the selected operation result to the determination unit 140.

The control signal generation unit 150 may generate the control signal CON based on at least one piece of information. For example, the control signal generation unit 150 may generate the control signal CON based on information LEVEL INF about the level of a voltage for reading the flag cells. For example, the control signal generation unit 150 may generate the control signal CON further based on information TYPE INF about the type of reading of the flag cells. The type of reading of the flag cells represents whether the flag cells are read according to a normal reading method or an inverse reading method. According to the normal reading method, if the threshold voltage of a flag cell is less than a read voltage level, the flag data FLAG DATA of the flag cell is determined to be "1". On the other hand, according to the inverse reading method, if the threshold voltage of a flag cell is less than the read voltage level, the flag data FLAG DATA of the flag cell is determined to be "0". When the determination unit 140 performs an OR operation and an AND operation, it generates a result of one of the two operations as the determination signal MSB_PGM FLAG in response to the control signal CON.

An exemplary embodiment of the determination unit 140 will now be described with reference to FIG. 3.

Figure 3:
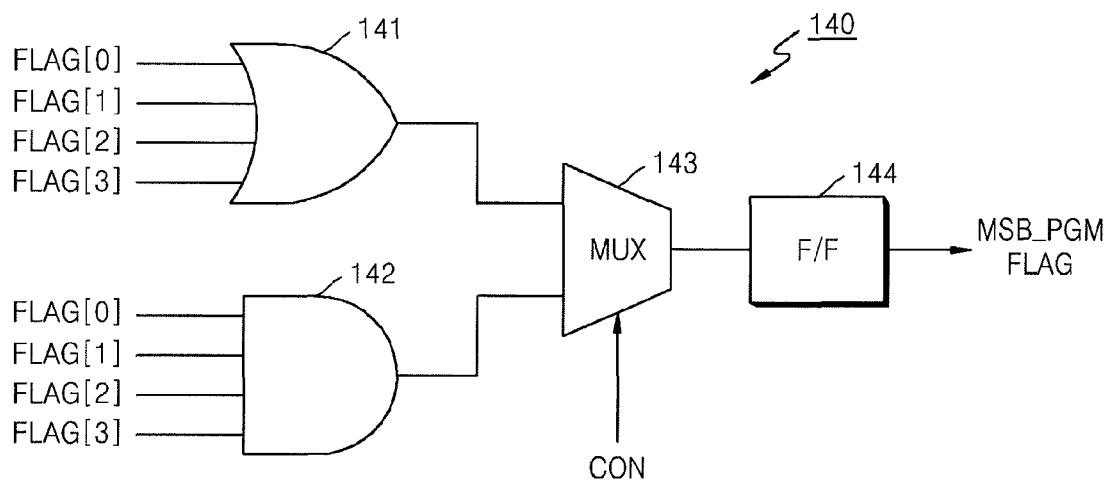
FIG. 3 is a circuit diagram of a determination unit shown in FIG. 2.

FIG. 3 is a circuit diagram of the determination unit 140 shown in FIG. 2. Referring to FIG. 3, the determination unit 140 includes a plurality of logic operation units which perform independent operations on the flag data FLAG DATA. The determination unit 140 may include a first arithmetic operation unit 141 for performing an OR operation and a second arithmetic operation unit 142 for performing an AND operation. The determination unit 140 may further include a multiplexer (MUX) 143.

In the exemplary embodiment of FIG. 3, four flag cells are allocated to each unit in which a memory cell is programmed (for example, each page). In this case, the first arithmetic operation unit 141 receives flag data FLAG[0] through FLAG[3], and the second arithmetic operation unit 142 also receives the flag data FLAG[0] through FLAG[3]. The first arithmetic operation unit 141 provides results of OR operations performed on the flag data FLAG[0] through FLAG[3] to the MUX 143. The second arithmetic operation unit 142 provides results of AND operations performed on the flag data FLAG[0] through FLAG[3] to the MUX 143. The MUX 143 outputs either the operation results output by the first arithmetic operation unit 141 or the operation results output by the second arithmetic operation unit 142 in response to the control signal CON. The selected operation results are provided as the determination signal MSB_PGM FLAG to the control unit 130 via a flip flop (F/F) 144 which may be further included in the determination unit 140.

Operations of the flash memory device 100 having a structure shown in FIGS. 2 and 3 will now be described in detail with reference to FIGS. 4 through 6.

Figure 4:
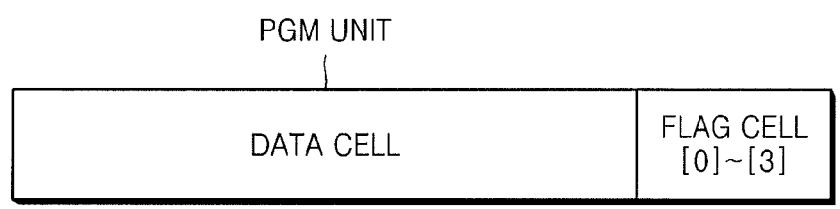
FIG. 4 illustrates an exemplary embodiment in which flag cells are included in the flash memory device shown in FIGS. 2 and 3.

FIG. 4 illustrates an exemplary embodiment in which flag cells are included in the flash memory device 100. In a multi-level cell, for example, a memory cell storing a plurality of bits of data, either data corresponding an LSB may be stored or up to data corresponding to an MSB may be stored, according to a programming stage. A plurality of flag cells may be allocated for a cell (for example, a data cell) that stores data corresponding to each programming (PGM) unit. In FIG. 4, four flag cells [0] through [3] are allocated to a data cell corresponding to each PGM unit. The number of flag cells may be controlled.

Figure 5:
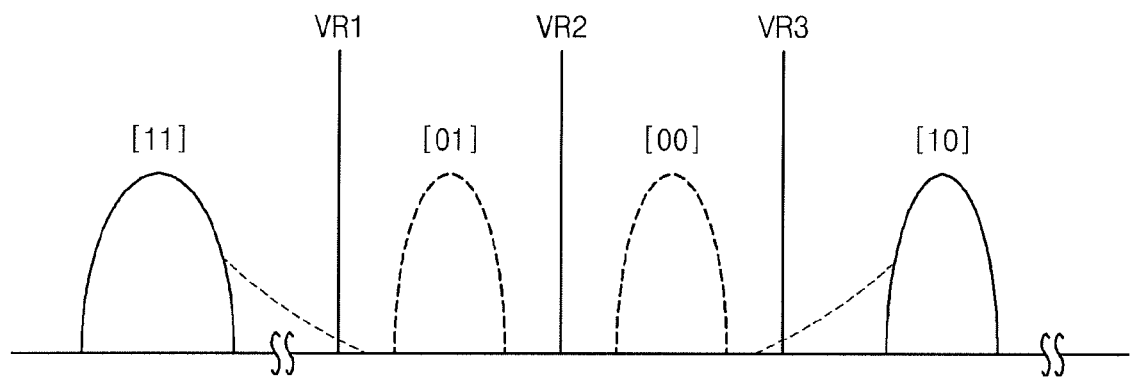
FIG. 5 illustrates threshold voltage distributions and read voltages of a flag cell.

FIG. 5 illustrates threshold voltage distributions of a flag cell and read voltages thereof. Where, for example, a multi-level cell stores 2-bit data, four threshold voltages are formed as shown in FIG. 4. Data stored in the multi-level cell may sequentially correspond to "11", "01", "00", and "10," as listed in order of increasing threshold voltages.

Each flag cell may be programmed with one of two threshold voltages according to a stage in which a memory cell corresponding to the flag cell is programmed. As shown in solid lines of FIG. 5, when only data corresponding to an LSB is stored in a memory cell, the threshold voltage of a flag cell corresponding to the memory cell may have a level corresponding to the lowest threshold voltage among the four threshold voltages, for example, the flag cell may have a level corresponding to "11". On the other hand, when data up to and including an MSB is stored in the memory cell, the threshold voltage of the flag cell corresponding to the memory cell may have a level corresponding to the highest threshold voltage among the four threshold voltages, for example, the flag cell may have a level corresponding to "10". Three voltages VR1, VR2, and VR3 may be set as the read voltages to distinguish the four threshold voltage distributions from one another.

As for flag cells programmed with threshold voltages as shown in FIG. 5, the threshold voltages may be changed after a PE cycle or a hot temperature stress (HTS). For example, a low threshold voltage (for example, corresponding to "11") with which some of the flag cells have been programmed may become greater than the read voltage VR1, or a high threshold voltage (for example, corresponding to "10") with which some of the flag cells have been programmed may become less than the read voltage VR3.

When only data corresponding to the LSB is stored in a memory cell, flag cells FLAG CELL[0] through FLAG CELL [3] corresponding to the memory cell are programmed with a low threshold voltage. Accordingly, when the flag cells FLAG CELL[0] through FLAG CELL[3] are read according to the normal reading method, flag data of "1" is read out. On the other hand, when the flag cells FLAG CELL[0] through FLAG CELL[3] are read according to the inverse reading method, flag data of "0" is read out. Accordingly, in the normal reading method, the flag data of "1" may be provided as the determination signal MSB_PGM FLAG to represent that only the LSB has been stored in the memory cell. In the inverse reading method, the flag data of "0" may be provided as the determination signal MSB_PGM FLAG to represent that only the LSB has been stored in the memory cell.

Here, it is assumed that the read voltage of the flag cells FLAG CELL[0] through FLAG CELL[3] is VR1 and reading is performed according to the normal reading method. When only the LSB is stored in a memory cell and thus the flag cells FLAG CELL[0] through FLAG CELL[3] are programmed with a low threshold voltage, the flag data of "1" is read from normal flag cells among the flag cells FLAG CELL [0] through FLAG CELL[3], and the flag data of "0" is read from some flag cells whose threshold voltages vary as shown in FIG. 5 from among the flag cells FLAG CELL[0] through FLAG CELL[3]. However, since the first arithmetic operation unit 141 performs an OR operation with respect to the flag data FLAG [0] through FLAG [3], the first arithmetic operation unit 141 outputs an operation result of "1". The operation result output by the first arithmetic operation unit 141 is provided as the determination signal MSB_PGM FLAG to the control unit 130 via the MUX 143 and the F/F 144.

On the other hand, when reading is performed according to the inverse reading method and the flag cells FLAG CELL[0] through FLAG CELL[3] are programmed with a low threshold voltage, the flag data of "0" is read from normal flag cells among the flag cells FLAG CELL[0] through FLAG CELL [3], and the flag data of "1" is read from flag cells from among the flag cells FLAG CELL[0] through FLAG CELL[3] whose threshold voltages vary as shown in FIG. 5. However, since the second arithmetic operation unit 142 performs an AND operation with respect to the flag data FLAG [0] through FLAG [3], the second arithmetic operation unit 142 outputs an operation result of "0". The operation result output by the second arithmetic operation unit 142 is provided as the determination signal MSB_PGM FLAG to the control unit 130 via the MUX 143 and the F/F 144.

According to an exemplary embodiment, since the first arithmetic operation unit 141 and the second arithmetic operation unit 142 have only to perform an OR operation and an AND operation, respectively, they may be more simply implemented than a circuit for determining execution or non-execution of MSB programming based on a conventional majority rule technique. According to the majority rule technique, when the threshold voltages of two of the four flag cells FLAG CELL[0] through FLAG CELL[3] vary, it is impossible to accurately determine whether MSB programming has been executed. However according to the exemplary embodiment, since a result of an OR or AND operation with respect to the flag data FLAG [0] through FLAG [3] is provided as the determination signal MSB_PGM FLAG, although three of the four flag cells FLAG CELL[0] through FLAG CELL[3] vary, an accurate determination signal MSB_PGM FLAG may be generated.

FIG. 6 illustrates a table showing read voltage levels of flag cells and different determination methods for different reading methods. As described above, depending on a voltage for reading a flag cell and/or a method of reading the flag cell, one of results of operations performed by the first and second arithmetic operation units 141 and 142 may be provided as the determination signal MSB_PGM FLAG. Accordingly, the control signal generation unit 150 of FIG. 2 receives information LEVEL INF about the level of a read voltage and/or information TYPE INF about a reading type, generates the control signal CON in response to the received information, and provides the control signal CON to the MUX 143.

As shown in FIG. 6, when the read voltage of flag cells is VR1 and reading is performed according to the normal reading method, the MUX 143 outputs a result of a logic operation (e.g., an OR operation) performed by the first arithmetic operation unit 141. Although flag cells are programmed with low threshold voltages and the threshold voltages of some of the flag cells are changed to be greater than the read voltage VR1, the MUX 143 selects and outputs a logic operation result corresponding to "1" output by the first arithmetic operation unit 141.

When the read voltage of flag cells is VR1 and reading is performed according to the inverse reading method, the MUX 143 selects and outputs a result of a logic operation (e.g., an AND operation) performed by the second arithmetic operation unit 142. When flag cells are programmed with low threshold voltages, although flag data of 0 is read from some of the flag cells and flag data of 1 is read from the residual flag cells due to a variation of the levels of the threshold voltages of the residual flag cells, the MUX 143 selects and outputs a logic operation result corresponding to "0" output by the second arithmetic operation unit 142.

When the read voltage of flag cells is VR2, the MUX 143 may output any of the results of the operations performed by the first and second arithmetic operation units 141 and 142. This is because when the read voltage of flag cells is VR2, readout of wrong flag data from the flag cells hardly occurs although the threshold voltages of the flag cells vary. For example, when the flag cells are programmed with low threshold voltages, an increase of the threshold voltages to a level greater than the read voltage VR2 rarely occurs although the threshold voltages vary. On the other hand, when the flag cells are programmed with high threshold voltages, an increase of the threshold voltages to a level less than the read voltage VR2 rarely occurs although the threshold voltages vary.

When the read voltage of flag cells is VR3 and reading is performed according to the normal reading method, the MUX 143 outputs a result of a logic operation (e.g., an AND operation) performed by the second arithmetic operation unit 142. When the flag cells are programmed with high threshold voltages, although flag data of 0 is read from some of the flag cells and flag data of 1 is read from the residual flag cells due to a variation of the levels of the threshold voltages of the residual flag cells (e.g., a decrease to a level less than the read voltage VR3), the MUX 143 selects and outputs a logic operation result corresponding to "0" output by the second arithmetic operation unit 142.

When the read voltage of flag cells is VR3 and reading is performed according to the inverse reading method, the MUX 143 selects and outputs a result of a logic operation (e.g., an OR operation) performed by the first arithmetic operation unit 141. When flag cells are programmed with high threshold voltages, although flag data of 1 is read from some of the flag cells and flag data of 0 is read from the residual flag cells due to a variation of the levels of the threshold voltages of the residual flag cells (e.g., a decrease to a level less than the read voltage VR3), the MUX 143 selects and outputs a logic operation result corresponding to "1" output by the first arithmetic operation unit 141.

According to an exemplary embodiment of the present invention as described above, a determination as to whether MSB programming has been performed on a multi-level cell of a flash memory device can be made efficiently and accurately.

While exemplary embodiments of the present invention have been particularly shown and described with reference to the figures, it will be understood by those of ordinary skill in the art that various changes in form and details may be made therein without departing from the spirit and scope of the present invention.

What is claimed is:

1. A flash memory device comprising:
   a cell array comprising at least one flag cell for storing information about whether MSB (most significant bit) programming has been performed on a multi-level cell;
   a control unit controlling a program operation, a read operation, and an erasure operation of the cell array; and
   a determination unit receiving flag data stored in the at least one flag cell, performing first and second arithmetic operations, on the flag data, and generating a determination signal based on a result of one of the first and second arithmetic operations according to at least one of a level of a voltage for reading the flag cells and a type of reading of the flag cells, wherein the determination signal represents whether the MSB programming has been performed.

2. The flash memory device of claim 1, wherein:
   the determination signal is provided to the control unit; and
   the control unit controls the program operation, the read operation, and the erasure operation according to a state of the determination signal.

3. The flash memory device of claim 1, wherein the determination unit provides a result of the first and second arithmetic operations as the determination signal according to a level of a voltage for reading the flag cells.

4. The flash memory device of claim 1, wherein the determination unit provides a result of the first and second arithmetic operations as the determination signal according to whether the flag cells are read with a normal reading method or an inverse reading method.

5. The flash memory device of claim 1, wherein the determination unit comprises:
   a first arithmetic operation unit receiving the flag data, performing the first arithmetic operation on the flag data, and outputting a first operation result; and
   a second arithmetic operation unit receiving the flag data, performing the second arithmetic operation on the flag data, and outputting a second operation result.

6. The flash memory device of claim 5, wherein the determination unit further comprises a multiplexer for receiving the first and second operation results and outputting either the first or second operation results.

7. The flash memory device of claim 6, wherein the determination unit further comprises a control signal generation unit which provides a control signal to the multiplexer controlling the multiplexer to output either the first or second operation results.

8. The flash memory device of claim 7, wherein the control signal generation unit generates the control signal based on information about a voltage level for reading the flag cells and information about whether the flag cells are read according to a normal reading method or an inverse reading method.

9. The flash memory device of claim 1, wherein n threshold voltage distributions are formed according to data stored in the multi-level cell, (n−1) voltages are set to read the data, and the flag cells are programmed with either a threshold voltage corresponding to a lowest threshold voltage distribution or a highest threshold voltage distributions, from among the threshold voltage distributions.

10. The flash memory device of claim 9, wherein when the voltage for reading the flag cells is a lowest voltage from among the (n−1) voltages and the flag cells are read according to a normal reading method, and the determination unit generates, as the determination signal, a result of the first arithmetic operation performed on the flag data.

11. The flash memory device of claim 9, wherein when the voltage for reading the flag cells is the lowest voltage from among the (n−1) voltages and the flag cells are read according to an inverse reading method, the determination unit generates, as the determination signal, a result of the second arithmetic operation performed on the flag data.

12. The flash memory device of claim 9, wherein when the voltage for reading the flag cells is a highest voltage from among the (n−1) voltages and the flag cells are read according to a normal reading method, the determination unit generates, as the determination signal, a result of the first arithmetic operation performed on the flag data.

13. The flash memory device of claim 9, wherein when the voltage for reading the flag cells is the highest voltage from among the (n−1) voltages and the flag cells are read according to an inverse reading method, the determination unit generates, as the determination signal, a result of the second arithmetic operation performed on the flag data.

14. The flash memory device of claim 9, wherein when the flag cells are read by voltages other than the highest and lowest voltages from among the (n−1) voltages, the determination unit arbitrarily generates one of results of the first or second arithmetic operations as the determination signal.

15. The flash memory device of claim 1, wherein a plurality of flag cells are arranged to correspond to each of programming units into which the multi-level cell is divided.

16. A flash memory device, comprising:
   at least one flag cell storing information about a stage in which a multi-level cell is programmed;
   a control unit controlling an operation of the flash memory device; and
   a determination unit performing an OR operation and an AND operation, on flag data stored in the at least one flag cell and generating a determination signal based on a result of the OR and the AND operations and information of at least one of a level of a voltage for reading the flag cells and a type of reading of the flag cells and determining the stage in which the multi-level cell is programmed.

17. The flash memory device of claim 16, wherein the information about the stage in which the multi-level cell is programmed includes information about whether LSB (least significant bit) programming has been performed on the multi-level cell or whether MSB programming has been performed on the multi-level cell.

18. The flash memory device of claim 16, wherein the determination unit provides a result of the OR operation or a result of the AND operation as the determination signal according to a level of a voltage for reading the flag cells.

19. A flash memory device, comprising:

at least one flag cell storing information about a stage in which a multi-level cell is programmed;

a control unit controlling an operation of the flash memory device; and a determination unit independently performing at least two logic operations in parallel on flag data stored in the at least one flag cell and generating a determination signal based upon one of the performed logic operations selected according to at least one of a level of a voltage for reading the flag cells and a type of reading of the flag cells and determining the stage in which the multi-level cell is programmed.

20. The flash memory device of claim 19, wherein the determination unit generates the determination signal by using both information of the level of the voltage for reading the flag cells and the type of reading of the flag cells, and the information of the type is information about whether a method of reading the flag cells is a normal reading method or an inverse reading method.

21. The flash memory device of claim 19, wherein the determination unit comprises:

a first arithmetic operation unit performing an OR operation on the flag data; and a second arithmetic operation unit performing an AND operation on the flag data.

* * * * *